United States Patent
Zhong (10) Patent No.: US 11,024,480 B2
(45) Date of Patent: Jun. 1, 2021

(54) METHOD AND SYSTEM FOR ZONE AXIS ALIGNMENT

(71) Applicant: FEI Company, Hillsboro, OR (US)

(72) Inventor: Zhenxin Zhong, Portland, OR (US)

(73) Assignee: FEI Company, Hillsboro, OR (US)

( * ) Notice: Subject to any disclaimer, the term of this patent is extended or adjusted under 35 U.S.C. 154(b) by 103 days.

(21) Appl. No.: 16/299,948

(22) Filed: Mar. 12, 2019

(65) Prior Publication Data
US 2020/0294759 A1 Sep. 17, 2020

(51) Int. Cl.
*H01J 37/26* (2006.01)
*H01J 37/295* (2006.01)
*H01J 37/20* (2006.01)

(52) U.S. Cl.
CPC ............ *H01J 37/20* (2013.01); *H01J 37/265* (2013.01); *H01J 37/295* (2013.01); *H01J 2237/1501* (2013.01)

(58) Field of Classification Search
CPC ........ H01J 37/20; H01J 37/265; H01J 37/261; H01J 37/295; H01J 37/2955
See application file for complete search history.

(56) References Cited

U.S. PATENT DOCUMENTS

| 9,978,557 | B2* | 5/2018 | Flanagan, IV | ........ H01J 37/261 |
| 2014/0284475 | A1* | 9/2014 | Own | ...................... H01J 37/261 250/307 |
| 2017/0133195 | A1* | 5/2017 | Yaguchi | ................ H01J 37/244 |
| 2019/0115187 | A1* | 4/2019 | Kawai | .................. H01J 37/265 |

FOREIGN PATENT DOCUMENTS

JP 2012103015 A * 5/2012

OTHER PUBLICATIONS

Jansen et al, "Towards Automatic Alignment of a Crystalline Sample in an Electron Microscope Along a Zone Axis", Ultramicroscopy 125 (2013) 59-65 (Year: 2013).*
J. Jansen, M.T. Often, H.W. Zandbergen, Towards automatic alignment of a crystalline sample in an electron microscope along a zone axis, Ultramicroscopy 125(2013) 59-65.

* cited by examiner

*Primary Examiner* — David E Smith (57) ABSTRACT

Various methods and systems are provided for aligning zone axis of a sample with an incident beam. As one example, the alignment may be based on a zone axis tilt. The zone axis tilt may be determined based on locations of a direct beam and a zero order Laue zone in the diffraction pattern. The direct beam location may be determined based on diffraction patterns acquired with different incident angles.

19 Claims, 10 Drawing Sheets

METHOD AND SYSTEM FOR ZONE AXIS ALIGNMENT

FIELD OF THE INVENTION

The present description relates generally to methods and systems for aligning a sample with an incident beam, and more particularly, to aligning a zone axis of a crystalline material with a beam of charged particles using diffraction patterns.

BACKGROUND OF THE INVENTION

In high resolution charged particle beam microscopy, in order to image a crystalline sample with high accuracy, the charged particle beam has to be aligned with a zone axis of the crystalline sample. If the zone axis of the sample is misaligned, such as when the zone axis is not oriented parallel to the incident beam, the measurement of the nanoscale features on the sample may be inaccurate. The process of aligning the sample crystal structure with the incident beam is referred to as zone axis alignment.

One method of zone axis alignment is using a diffraction pattern of the sample. For example, when collimated charged particles passing through a thin crystalline sample, the charged particles interfere with each other and form a diffraction pattern on the back focal plane of an objective lens positioned below the sample. The diffraction pattern consists of multiple bright spots. Each bright spot results from diffraction of the charged particles from a specific set of planes within the crystal structure. The alignment between the zone axis and the incident beam may be adjusted based on distribution of the bright spots in the diffraction pattern.

SUMMARY

In one embodiment, a method for aligning a zone axis of a sample with an incident beam comprises acquiring a first diffraction pattern of the sample by directing the incident beam at a first angle towards the sample, acquiring a second diffraction pattern of the sample by directing the incident beam at a second angle towards the sample, determining a location of a direct beam in the first diffraction pattern based on the first diffraction pattern and the second diffraction pattern, and aligning the zone axis of the sample with the incident beam based on the location of the direct beam. In this way, the zone axis of the sample and the incident beam may be automatically aligned based on the location of the direct beam determined from a plurality of diffraction patterns.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

Like reference numerals refer to corresponding parts throughout the several views of the drawings.

DETAILED DESCRIPTION OF EMBODIMENTS

The following description relates to systems and methods for imaging a sample with an incident beam. For example, a zone axis of the sample may be aligned with the incident beam based on diffraction patterns of the sample directly with an imaging system, such as a scanning transmission electron microscopy (STEM) system shown in FIG. 1.

Figure 2A:
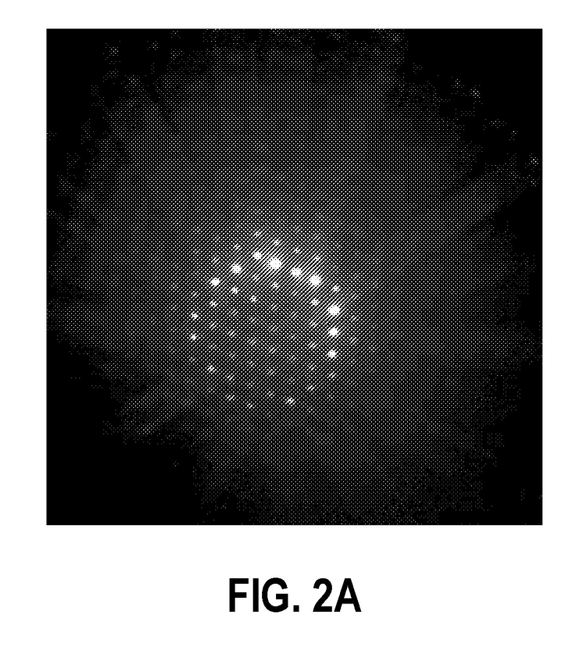
FIG. 2A shows an example diffraction pattern acquired using a collimated beam.
Figure 2B:
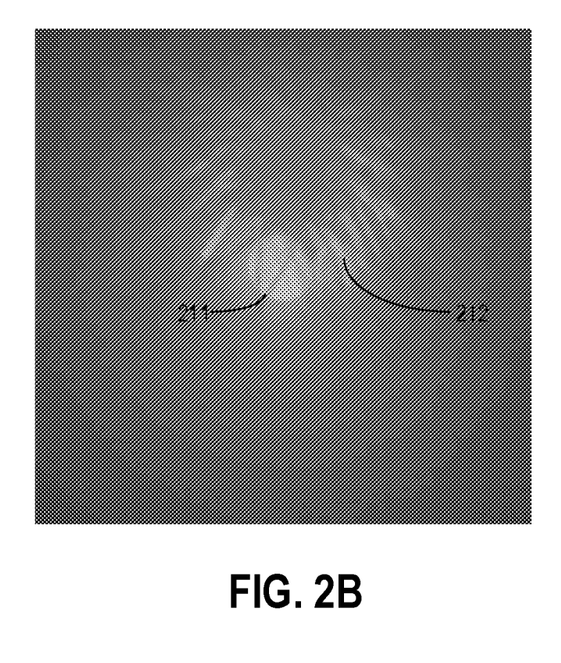
FIG. 2B shows an example diffraction pattern acquired using a convergent beam.

FIGS. 2A and 2B show example diffraction patterns of crystalline samples acquired using a collimated incident beam and a convergent incident beam, respectively. When the incident beam is collimated, misalignment between the zone axis of the sample and the incident beam may be determined based on locations of the direct beam and the zero order Laue zone (ZOLZ) in the diffraction pattern. The direct beam location may be manually assigned by the operator. However, under certain conditions, the direct beam location may be difficult to identify in the diffraction pattern. For example, the diffraction pattern may include two spots with the maximum intensities in the two beam condition or when intense beam illumination leads to the saturation of the camera. FIG. 2A shows an example diffraction pattern generated with a collimated beam. The direct beam in FIG. 2A is not the only spot having the maximum intensity, nor does it locate at the center of the image. When the incident beam is convergent, such as in the STEM system, the diffraction pattern is different from the diffraction pattern generated with the collimated beam. As an example, FIG. 2B shows a diffraction pattern generated with a convergent beam. In FIG. 2B, the area of direct beam 211 increases with increased beam convergent angle. Further, the diffraction pattern 212 along the ZOLZ forms a disk and is overlapped with the direct beam 211. One method for aligning the sample with the convergent incident beam is first aligning the sample with a collimated beam, then switching the collimated beam to the convergent beam. However, this method may be slow and inaccurate due to frequent switching between imaging modes, beam convergent angles, or aperture sizes.

Figure 3:
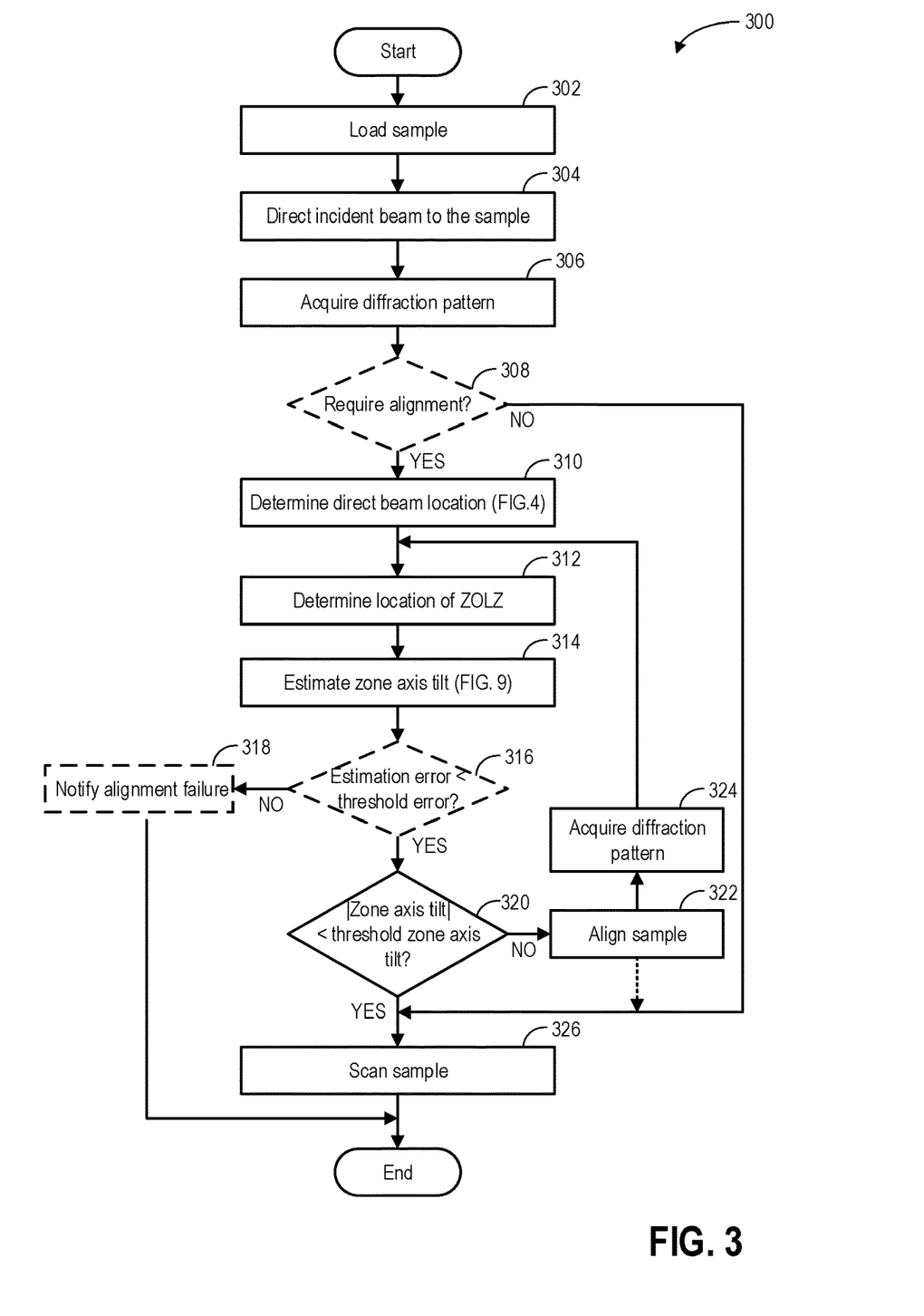
FIG. 3 is an example method for imaging a sample.
Figure 4:
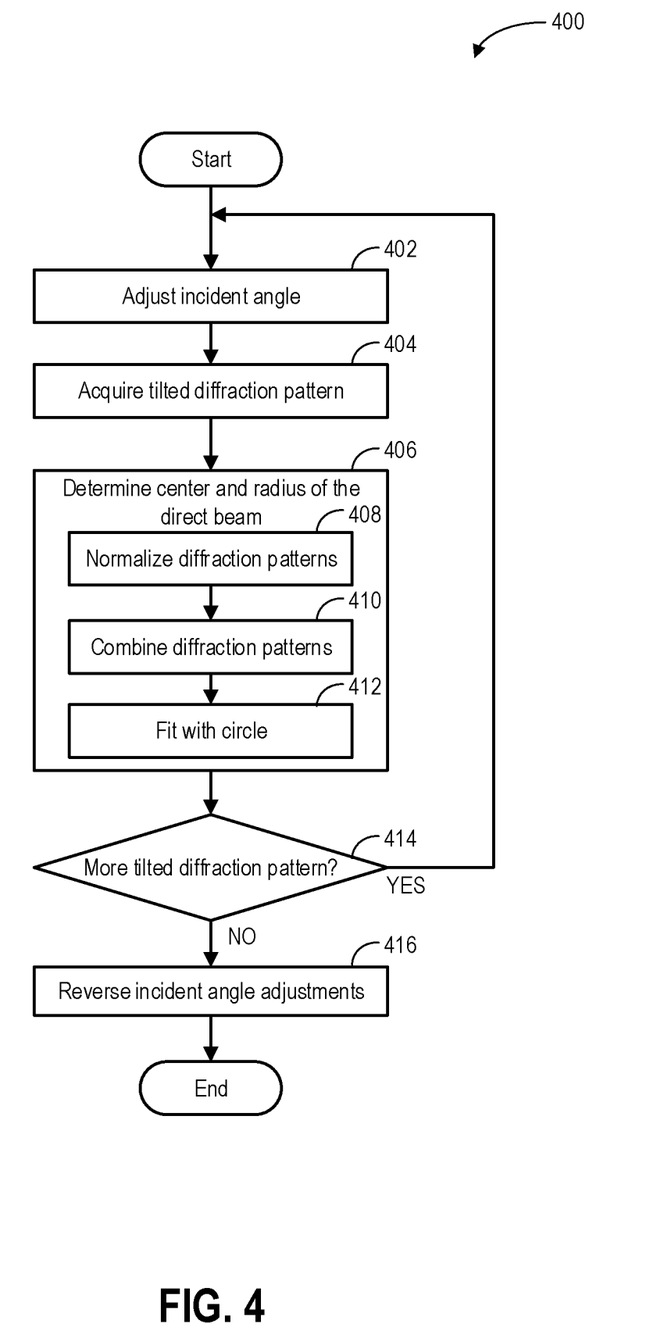
FIG. 4 is an example subroutine for determining a direct beam location.
Figure 8:
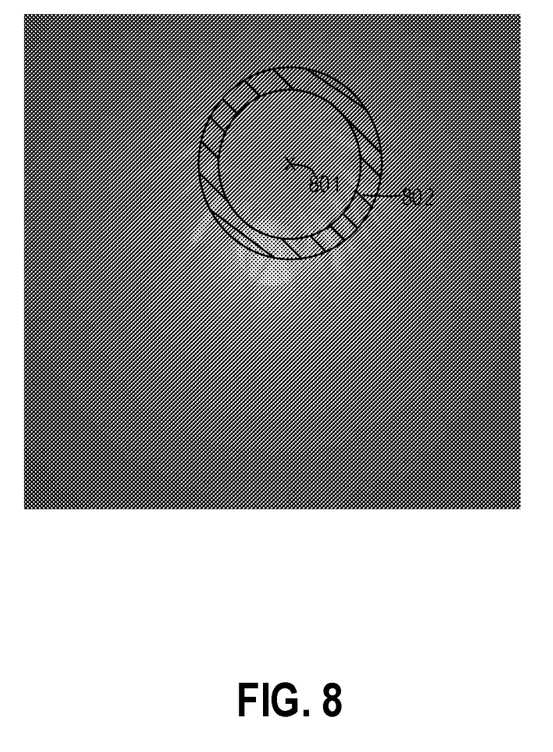
FIG. 8 illustrates fine adjustments to the ZOLZ location.
Figure 9:
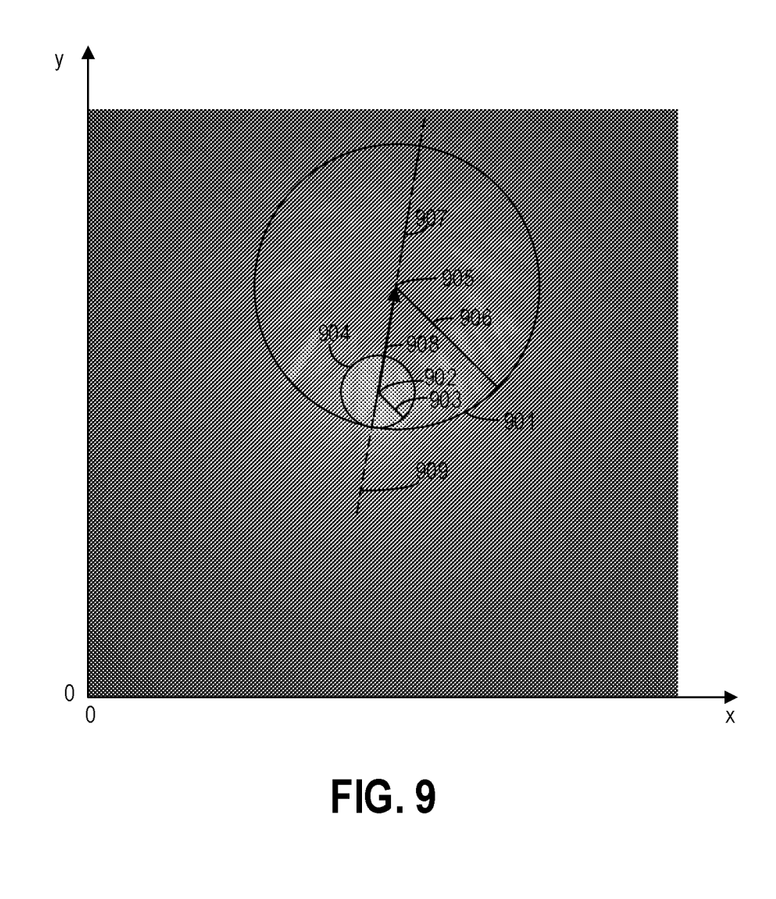
FIG. 9 illustrates a zone axis tilt determined based on locations of the direct beam and the ZOLZ in a diffraction pattern.
Figure 10:
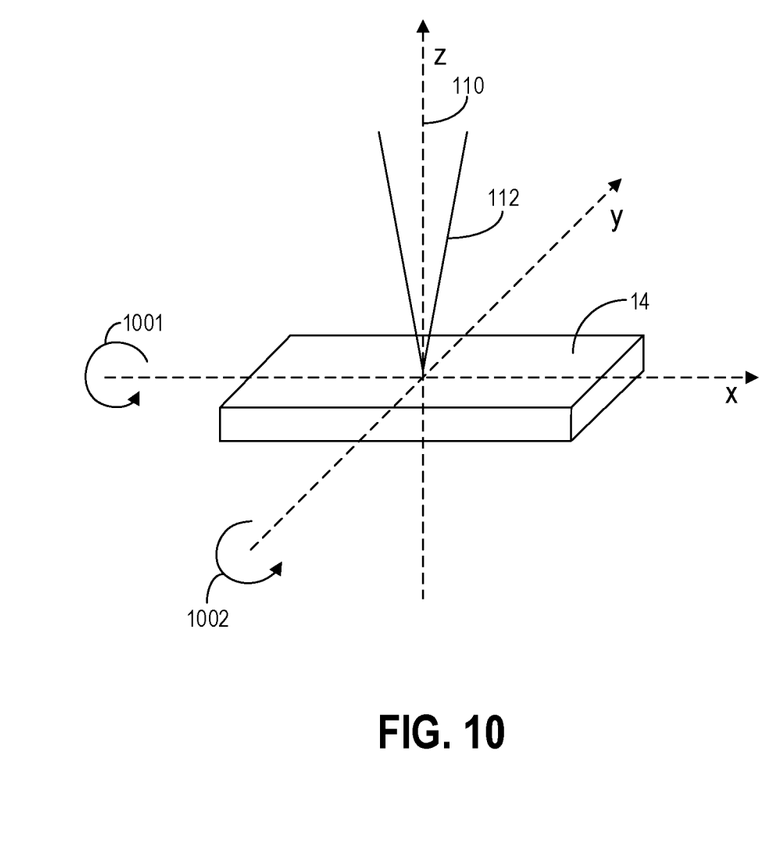
FIG. 10 illustrates the coordinate system for adjusting the sample orientation.

The above issues may be addressed by a method shown in FIG. 3, wherein the zone axis of the sample may be directly aligned with the convergent incident beam. In particular, a zone axis tilt between the zone axis of the sample and the incident beam may be determined based on the locations of the direct beam and the ZOLZ in the diffraction pattern. As shown in FIG. 4, the direct beam location may be determined from a combined diffraction pattern generated from diffraction patterns acquired with different incident angles. FIGS. 5A-5D show example diffraction patterns and the combined diffraction pattern. FIG. 6 is an example method for determining the location of the ZOLZ in the diffraction pattern. The location of the ZOLZ may be determined based on an intensity curve generated by rotating the diffraction pattern, as illustrated in FIGS. 7A-7E. The ZOLZ location may further be adjusted as illustrated in FIG. 8. FIG. 9 illustrates estimating the zone axis tilt based on locations of the direct beam and the ZOLZ location in the diffraction pattern. The coordinate for adjusting the sample orientation in the imaging system is shown in FIG. 10.

Figure 1:
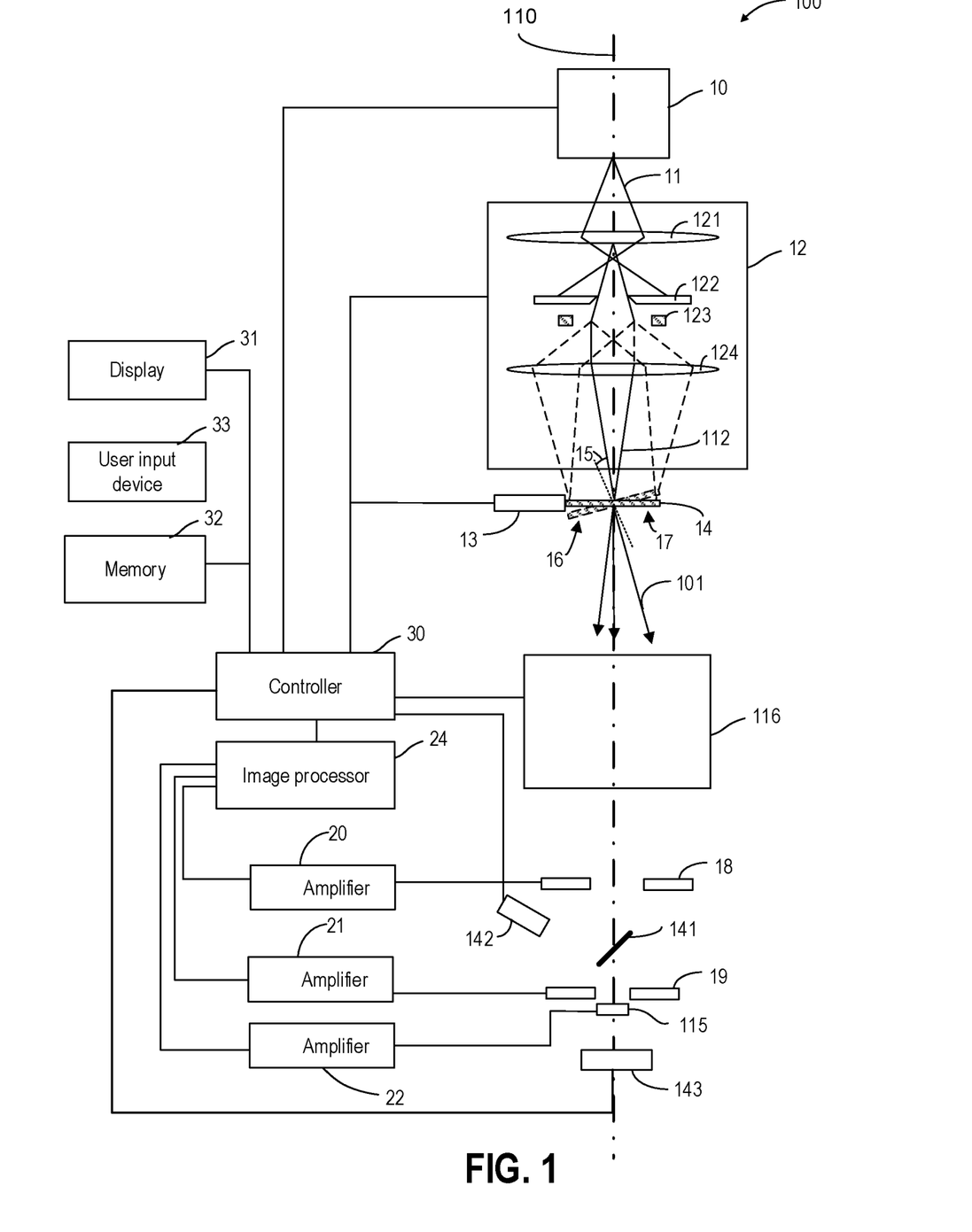
FIG. 1 is a diagram of an imaging system according to an exemplary embodiment of the invention.

Turning to FIG. 1, a STEM system 100 in accordance with an embodiment of the disclosure is shown. The STEM system 100 includes an electron source 10 that emits charged particles, such as electron beam 11, towards a focusing column 12. The electron beam may generate high energy electrons, that is, electrons having typical energies of between about 10 keV and 1,000 keV. In some embodiments, the focusing column 12 may include one or more of a condenser lens 121, aperture 122, scan coils 123, and upper objective lens 124. The focusing column 12 focuses electrons from electron source 10 into a small spot on sample 14. Different locations of the sample may be scanned by adjusting the electron beam direction via the scan coils 123. For example, by operating scan coils 123, incident beam 112 may be shifted (as shown with dashed lines) to focus onto different locations of sample 14. The sample 14 may be thin enough to not impede transmission of most of the electrons in the electron beam 11.

Optical axis 110 of the imaging system may be the central axis of the electron beam emitted from the electron source 10. Optical axis 110 may also be the central axis of the condenser lens 121. When the incident beam is not shifted or scanned (that is, incident beam 112), the incident beam may be focused at the location where the optical axis 110 intersects the sample 14.

The sample 14 may be held by a sample holder 13. The sample holder 13 may adjust sample orientation by tilting and translating the sample. As an example, FIG. 10 illustrates the coordination system for adjusting the sample orientation. In FIG. 10, the incident beam 112 may be focused on sample 14 along the optical axis 110 of the imaging system. The z-axis may be parallel to the optical axis. The x-y plane may be a plane perpendicular to the z-axis. The sample 14 may be tilted relative to the optical axis 110 by rotating around the x-axis or around the y-axis. For example, the rotation direction around the x-axis may be the alpha tilt direction 1001, and the rotation direction around the y-axis may be the beta tilt direction 1002. The sample holder may also translate or shift the sample 14 along any of the x-axis, y-axis, and z-axis. In some embodiments, the sample 14 may be rotated around the z-axis.

Turning back to FIG. 1, as one example, when the sample holder 13 tilts sample 14 from position 17 (solid line, with sample normal to the optical axis) to position 16 (dashed line), the incident angle 15 between the axis normal to the sample surface and the optical axis 110 increases. Before scanning or imaging the sample 14, the zone axis of the sample 14 may be adjusted to be aligned with the incident beam 112 by adjusting the sample holder 13. The zone axis of the sample may be aligned with the incident beam when the zone axis is parallel to the optical axis of the imaging system.

Electrons 101 passing through sample 14 may enter projector 116. In one embodiment, the projector 116 may be a separate part from the focusing column. In another embodiment, the projector 116 may be an extension of the lens field from a lens in focusing column 12.

The projector 116 may be adjusted by the controller 30 so that direct electrons passed through the sample, impinge on disk-shaped bright field detector 115, while diffracted or scattered electrons, which were more strongly deflected by the sample, are detected by one or more of a high-angle annular dark-field (HAADF) detector 18 and a annular dark-field (ADF) detector 19. Signals from the HAADF and ADF detectors may be amplified by amplifier 20 and amplifier 21, respectively. Signals from bright field detector 115 may be amplified by amplifier 22. Signals from the amplifiers 20, 21, and 22 may be sent to image processor 24, which can form an image of sample 14 from the detected electrons. The HAADF detector 18, ADF detector 19, and bright field detector 115 may be a scintillator-photomultiplier detector or a solid-state PIN detector. The STEM system 100 may simultaneously detect signals from one or more of the ADF detector, the ADF detector, and the HAADF detector.

The zone axis of the sample 14 may be aligned with the incident beam 112 based on diffraction patterns of the sample 14 acquired when irradiating the sample with incident beam 112. In one embodiment, the diffraction pattern may be acquired via camera 142 by capturing the diffraction pattern formed on the flu-screen 141. The flu-screen 141 may be inserted between the projector 116 and the bright field detector 115 during zone axis alignment. For example, the flu-screen 141 may be positioned between the HAADF detector 18 and LAADF detector 19. In another embodiment, the diffraction pattern on the flu-screen may be captured via camera 143 positioned downstream of the bright field detector 115. The camera 143 may be CCD or CMOS camera or a pixelated STEM detector. The acquired diffraction patterns may be sent to the controller 30 for determining the zone axis tilt.

The controller 30 may control the operation of the imaging system 100, either manually in response to operator instructions or automatically in accordance with computer readable instructions stored in non-transitory memory 32. The controller 30 can be configured to execute the computer readable instructions and control various components of the imaging system 100 in order to implement any of the methods described herein. For example, the controller may adjust the scanning location on the sample by operating the scan coils 123. The controller may adjust the profile of the incident beam by adjusting one or more apertures and/or lens in the focusing column 12. The controller may adjust the sample orientation relative to the incident beam by adjusting the sample holder 13. The controller 30 may further be coupled to a display 31 to display notifications and/or images of the sample. The controller 30 may receive user inputs from user input device 33. The user input device 33 may include keyboard, mouse, or touchscreen.

Though a STEM system is described by way of example, it should be understood that the present techniques may be used to zone axis alignment with collimated incident beam. The present techniques may also be useful when applied to sample alignment in other charged particle beam microscopy systems, such as transmitting electron microscopy (TEM) system, scanning electron microscopy (SEM) system, and dual beam microscopy system. The present discussion of STEM imaging is provided merely as an example of one suitable imaging modality.

Turning to FIG. 3, an example method 300 for imaging a sample is shown. The zone axis tilt between the zone axis of the sample and the incident beam is first estimated using diffraction patterns acquired by directing the incident beam at different incident angles towards a location of the sample. The sample orientation is then adjusted based on the zone axis tilt before imaging or scanning the sample.

At 302, the sample is loaded into the imaging system, such as imaging system 100 of FIG. 1. For example, a thin sample may be loaded onto a sample holder (such as sample holder 13 of FIG. 1) positioned in a vacuum chamber of the imaging system.

At 304, the incident beam may be directed to the sample along the optical axis of the imaging system. Herein, the incident beam may be the charged particle beam directly interacting with the sample without its profile or beam path being modified by any components of the imaging system. For example, in the imaging system 100 of FIG. 1, the incident beam 112 irradiates sample 14 along the optical axis 110. The incident beam 112 is directed to the sample without being tilted by the scan coils 123. In one embodiment, directing the incident beam to the sample may include directing the incident beam to a region of interest (ROI) of the sample. The ROI may be a region including crystalline structure.

At 306, a diffraction pattern of the sample may be acquired using the incident beam. In one embodiment, acquiring the diffraction pattern may include inserting the flu-screen (such as flu-screen 141 of FIG. 1), and taking a picture of the diffraction pattern formed on the flu-screen via a camera (such as camera 142 or camera 143 of FIG. 1). The acquired diffraction pattern is in the form of a two-dimensional image. For example, the diffraction pattern may be shown in grey-scale as shown in FIGS. 2A-2B. The bright pixels correspond to higher signal intensity, while the dark pixels correspond to lower signal intensity.

The diffraction pattern includes a direct beam. The direct beam may appear to be a bright round spot in the diffraction pattern. The center of the direct beam may locate at a position where the optical axis (such as optical axis 110) of the imaging system intersects the plane in which the diffraction pattern is formed. The plane may be the surface of the flu-screen (such as the flu-screen 141 of FIG. 1). The size or radius of the direct beam may be determined by the convergent angle of the incident beam. For example, the direct beam is a small spot when the incident beam is collimated. The radius of the direct beam increases with increased convergent angle. The direct beam may locate at a location of the diffraction pattern when the diffraction pattern is captured without positioning the sample in the electron beam.

At 308, method 300 optionally determines whether zone axis alignment is required based on the diffraction pattern of 306. In some embodiments, the diffraction pattern may be displayed on the display and assessed by the operator. In other embodiments, the diffraction pattern may be analyzed automatically by executing instructions stored in the non-transitory memory to determine whether the zone axis of the sample is aligned with the incident beam. For example, the misalignment may be determined based on the center of mass in the diffraction pattern 306. If the zone axis alignment is satisfactory and no further alignment is required, the sample is imaged or scanned at 326. Otherwise, method 300 proceeds to step 310 to align the sample.

At 310, the location of direct beam in the diffraction pattern of 306 is determined. Determining the direct beam location in the diffraction pattern may include determining the location of the center of the direct beam and the radius of the direct beam. As shown in detail in FIG. 4, the location of the direction beam may be determined by combining diffraction patterns acquired with different incident angles and fitting a circle to the combined diffraction pattern. The diffraction patterns with different incident angles may be acquired for example by tilting the sample relative to the incident beam via the sample holder.

At 312, the location of the ZOLZ in the diffraction pattern is determined based on the direct beam location. Location of the ZOLZ includes the center position and the radius of the ZOLZ. If the zone axis of the sample has not been aligned with the incident beam, the ZOLZ location in the diffraction pattern acquired at 306 may be determined. If the zone axis of the sample has been aligned with the incident beam, the ZOLZ location in the most recently acquired diffraction pattern at 324 may be determined. In some embodiments, the diffraction pattern may be a tilted diffraction pattern acquired after tilting the sample relative to the incident beam at a known tilt angle (such as the tilt angle the controller sent to the sample holder). For example, the tilted diffraction pattern may be acquired at 310 while determining the direct beam location. After determining the ZOLZ location in the tilted diffraction pattern, the ZOLZ location in the other diffraction patterns, such as the un-tilted diffraction pattern acquired at 306 or other tilted diffraction patterns, may be estimated based on the ZOLZ location in the tilted diffraction pattern and the known tilt angle.

In one embodiment, the ZOLZ location may be determined based the direct beam location and the center of mass in the diffraction pattern. The ZOLZ location may be determined based on the center of mass in the diffraction pattern when the misalignment of zone axis (or zone axis tilt) is relatively small (such as 1 degree). In one example, the center of mass in the diffraction pattern may be determined using image processing procedures such as noise removal, contrast enhancement, and image thresholding.

In another embodiment, location of the ZOLZ may be determined by determining an axis passing the centers of the direct beam and the ZOLZ. For example, the axis passing the centers of the direct beam and the ZOLZ may be determined based on an integrated intensity of pixel values within an intensity integral region as the diffraction pattern rotates relative to the center of the direct beam. Details for determining the ZOLZ location based on the intensity curve are shown in FIG. 6.

At 314, the zone axis tilt is estimated based on the location of direct beam from 310 and the location of ZOLZ from 312. In one example, the zone axis tilt may include an alpha tilt angle, a beta tilt angle, or a combination of the alpha tilt angle and the beta angle. The process of estimating the zone axis tilt is illustrated in detail in FIG. 9.

At 316, the error in the zone axis tilt estimation may optionally be determined and compared with a threshold estimation error. If the estimation error is less than the threshold estimation error, method 300 may proceed to 320 and align the sample based on the estimated zone axis tilt. The threshold estimation error may for example be 0.5 degrees in each tilt direction (such as the alpha tilt direction or the beta tilt direction) of the sample holder. Otherwise, if the estimation error is greater than the threshold estimation error, at 318, alignment failure may be reported to the operator via the display. In response to the notification, the operator may choose other methods for zone axis alignment.

The error in the zone axis tilt estimation may be determined based on the estimated tilt angle and a commanded tilt angle (such as the tilt angle the controller sent to the sample holder) between two diffraction patterns. In some embodiments, a first diffraction pattern is acquired with a first incident angle at a location of the sample. The incident angle may be adjusted from the first incident angle to a second incident angle by tilting the sample relative to the incident beam with the commanded tilt angle. A second diffraction pattern at the same location of the sample may be acquired with the second incident angle. The difference between the first and second incident angles may be estimated based on the locations of the direct beam and the ZOLZ in each of the diffraction patterns. The location of the direct beam in the first and second diffraction patterns may be the same as the direct beam location at 310. The ZOLZ location in the diffraction patterns may be determined according to the method of FIG. 6. In one example, the first diffraction pattern is the diffraction pattern acquired at 306, and the second diffraction pattern is the tilted diffraction pattern acquired at 310. The estimated difference between the first and second incident angles may be compared with the commanded tilt angle to determine error in the zone axis tilt estimation.

At 320, the absolute value of the estimated zone axis tilt from 314 is compared with a threshold zone axis tilt angle. The threshold zone axis tilt angle may correspond to an acceptable alignment error. For example, the threshold zone axis tilt angle may be 0.5 degree in each tilt direction. If the absolute value of the estimated zone axis tilt is within the threshold zone axis tilt angle, the zone axis alignment may be completed, and the sample may be subsequently scanned or imaged at 326. If the absolute value of the zone axis tilt is greater than the threshold zone axis tilt angle, the zone axis of the sample may be aligned with the incident beam at 322.

At 322, the sample is aligned with the incident beam by adjusting the incident angle based on the zone axis tilt estimated at 314. In one embodiment, the incident angle may be adjusted by tilting the sample based on the zone axis tilt angle in each tilt direction (such as alpha and beta tilt directions). In one embodiment, after adjusting the incident angle, the sample may be repositioned by shifting or translating in the x-y plane and z axis to ensure that the same feature (or ROI) is imaged before and after adjusting the incident angle. In other words, the sample may be shifted to ensure that the same location of the sample is in the field of view before and after adjusting the incident angle. For example, images of the sample before and after adjusting the incident angle may be acquired by scanning the incident beam over the sample surface. The acquired images may be either the darkfield image or the bright field image. The sample position may be adjusted by matching the acquired images.

In some embodiments, the sample may be repositioned before scan the sample at 326, after the zone axis alignment process, to ensure the same ROI is imaged. The sample maybe repositioned based on images of the sample acquired before and after the zone axis alignment.

In some embodiments, the sample may be scanned at 326 after aligning the zone axis. In other embodiments, method 300 may proceed to 324 to further align the zone axis. For example, after acquiring another diffraction pattern of the aligned sample at 324, and the zone axis tilt is estimated again based on the newly acquired diffraction pattern.

At 326, the sample is scanned or imaged. The sample may be scanned or imaged without changing the optical mode or incident beam convergent angle after performing the zone axis alignment. In some embodiments, the incident beam is a convergent beam, such as in the STEM system of FIG. 1. The zone axis alignment is performed with the convergent incident beam (such as incident beam 112 of FIG. 1) in the STEM diffraction mode. After zone axis alignment, the sample may be imaged by scanning the incident beam over the sample. In one example, the sample may be scanned under the same imaging mode, incident beam convergent angle, and the aperture of the focusing column as during the zone axis alignment. As such, zone axis alignment may be automatically performed in a short period of time with high accuracy and robustness.

In this way, the zone axis tilt may be estimated automatically based on multiple diffraction patterns acquired with different incident angles. The estimation is not sensitive to the beam convergent angle and does not require prior information about direct beam location. As a result, zone axis alignment may be implemented in the STEM diffraction mode, with minimal or no adjustment to the imaging system.

FIG. 4 is a subroutine 400 for determining location of the direct beam in the diffraction pattern. The location of the direct beam includes location of the direct beam center and the size, such as radius, of the direct beam. In one example, multiple diffraction patterns with different incident angles are combined. Because the direct beam location remains the same in the diffraction patterns, the direct beam in the combined diffraction pattern has the maximum intensity and may be identified. The location of the direct beam may then be estimated based on the combined diffraction pattern.

At 402, the beam incident angle is adjusted. In one embodiment, the incident angle may be adjusted by tilting the sample relative to the incident beam at a tilt angle. In one example, the sample may be tilted in the alpha tilt direction or the beta tilt direction. In another example, the tilt direction may be determined based on the performance of the sample holder. If the sample holder can tilt the sample in the alpha tilt direction with a higher accuracy than in the beta tilt direction, the sample may be tilted in the alpha tilt direction using the sample holder. The tilt angle may be predetermined. The accuracy for determining the direct beam location increases with the increased tilt angle. In some embodiments, the tilt angle may be between 2 and 25 degrees. In one example, the tilt angle is 3 degrees. In other embodiments, the incident angle may be adjusted by tilting the incident beam relative to the optical axis of the system. In some embodiments, after adjusting the incident angle, the sample may be repositioned by shifting or translating in the x-y plane and refocused in the z axis. In other words, the sample may be adjusted to ensure that the same ROI of the sample is in the field of view before and after adjusting the incident angle. In one example, the sample may be repositioned after adjusting the incident angle if the zone axis tilt estimation error is to be determined at 316.

At 404, a tilted diffraction pattern is acquired. The direct beam location may be determined based on the un-tilted diffraction pattern acquired at 306 of FIG. 3 and the tilted diffraction pattern.

At 406, the center and radius of the direct beam in the diffraction patterns are determined. The direct beam location is the same in both the un-tilted diffraction pattern at 306 of FIG. 3 and the tilted diffraction pattern. In other words, the direct beam location in the diffraction pattern is not affected by changes of the incident angle.

In one embodiment, the center and radius of the direct beam may be determined by detecting the edge of the direct beam in a combined diffraction pattern shown in steps 408-412.

At 408, each diffraction pattern is normalized to the same dynamic range of pixel values. In particular, each of the diffraction pattern from 306 of FIG. 3 and the tilted diffraction pattern of 404 is normalized. For example, the dynamic range may be values from 0 to 255.

At 410, the normalized diffraction patterns are combined to form a combined diffraction pattern. In one embodiment, combining the diffraction patterns includes taking a running average of the normalized diffraction patterns. For example, at each pixel location, an average of the pixel values in the normalized diffraction patterns is calculated to obtain the pixel value of the combined diffraction pattern at the pixel location.

At 412, the edge of the direct beam in the combined diffraction pattern may be fitted by a circle representing the perimeter of the direct beam. In some embodiments, before circle fitting, the combined diffraction pattern may be thresholded to remove pixels having low value. The circle fitting may be performed for example by using the circular Hugh Transform method. The center of the fitted circle in the diffraction pattern is the location of the direct beam, and the radius of the fitted circle is the radius of the direct beam.

At 414, subroutine 400 may determine whether additional tilted diffraction pattern is required. For example, more diffraction patterns may be required responsive to circle fitting failure at 406. The circle may not be successfully fitted to the combined diffraction pattern if the direct beam in the combined diffraction pattern does not have enough signal contrast. If more tilted diffraction patterns are required, the incident angle may be further adjusted at 402, and one or more additional tilted diffraction patterns may be acquired. In one embodiment, the incident angle may first be increased by a first tilt angle, then reduced by a second tilt angle. In another embodiment, the incident angle may be continuously increased during the incident angle adjustments. In one example, the maximum incident angle may be limited by the maximum tilt angle of the sample holder. In another example, the maximum incident angle may be less than 25 degrees. If no more tilted diffraction patterns are required, subroutine 400 proceeds to 416.

At 416, the incident angle may be adjusted back to the incident angle before subroutine 400 is executed. For example, the incident angle may be adjusted by reversing each incident angle adjustment performed at 402. After adjusting the incident angle to the incident angle before subroutine 400 is executed, the sample may be repositioned so that the same feature or location of the sample is in the field of view by aligning the sample in the x-y plane and along the z-axis. For example, images of the sample before adjusting the incident angle (before executing the subroutine 400) and after reversing the incident angle adjustments may be acquired. Correlation between the acquired images may be used for sample alignment.

In this way, the direct beam location may be determined using a plurality of diffraction patterns acquired at different incident angles. In some embodiments, the number of the tilted diffraction patterns may be predetermined. For example, the two tilted diffraction patterns may be acquired by tilting the sample holder along a tilt direction and against the tilt direction. For example, the tilted diffraction patterns may be acquired at 3 degrees and −3 degrees along the alpha tilt direction. The direct beam location may be determined by combining diffraction patterns from the two tilted diffraction patterns and the un-tilted diffraction pattern from 306 of FIG. 3.

Figure 5A:
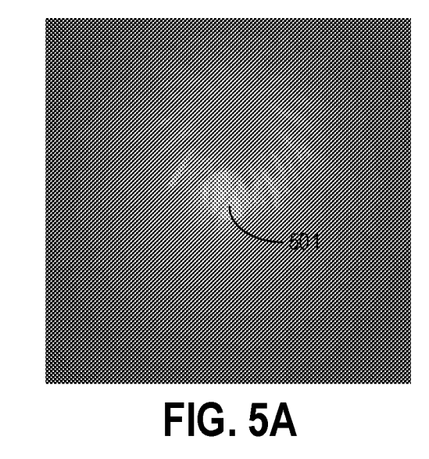
FIGS. 5A, 5B, and 5C are diffraction patterns acquired at different tilt angles.
Figure 5B:
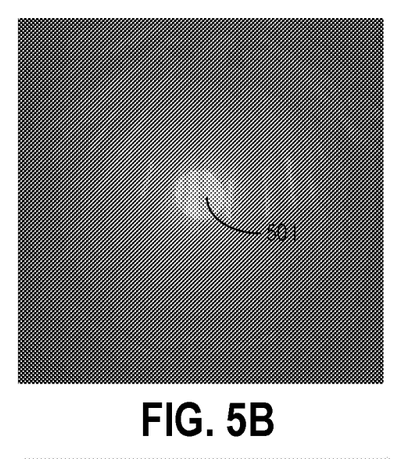
Figure 5C:
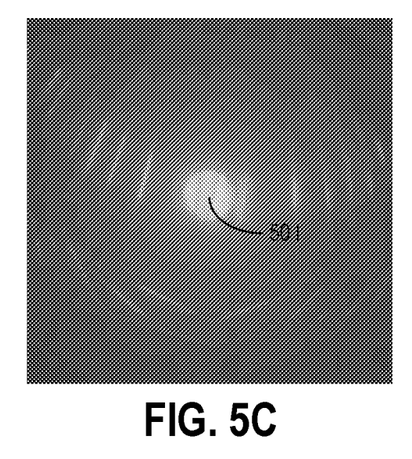
Figure 5D:
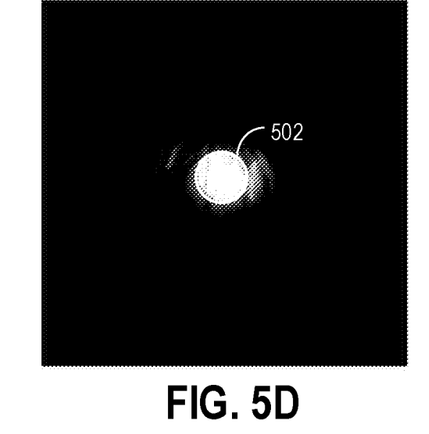
FIG. 5D is a combined diffraction pattern generated based on the diffraction patterns of FIGS. 5A-5C.
Figure 6:
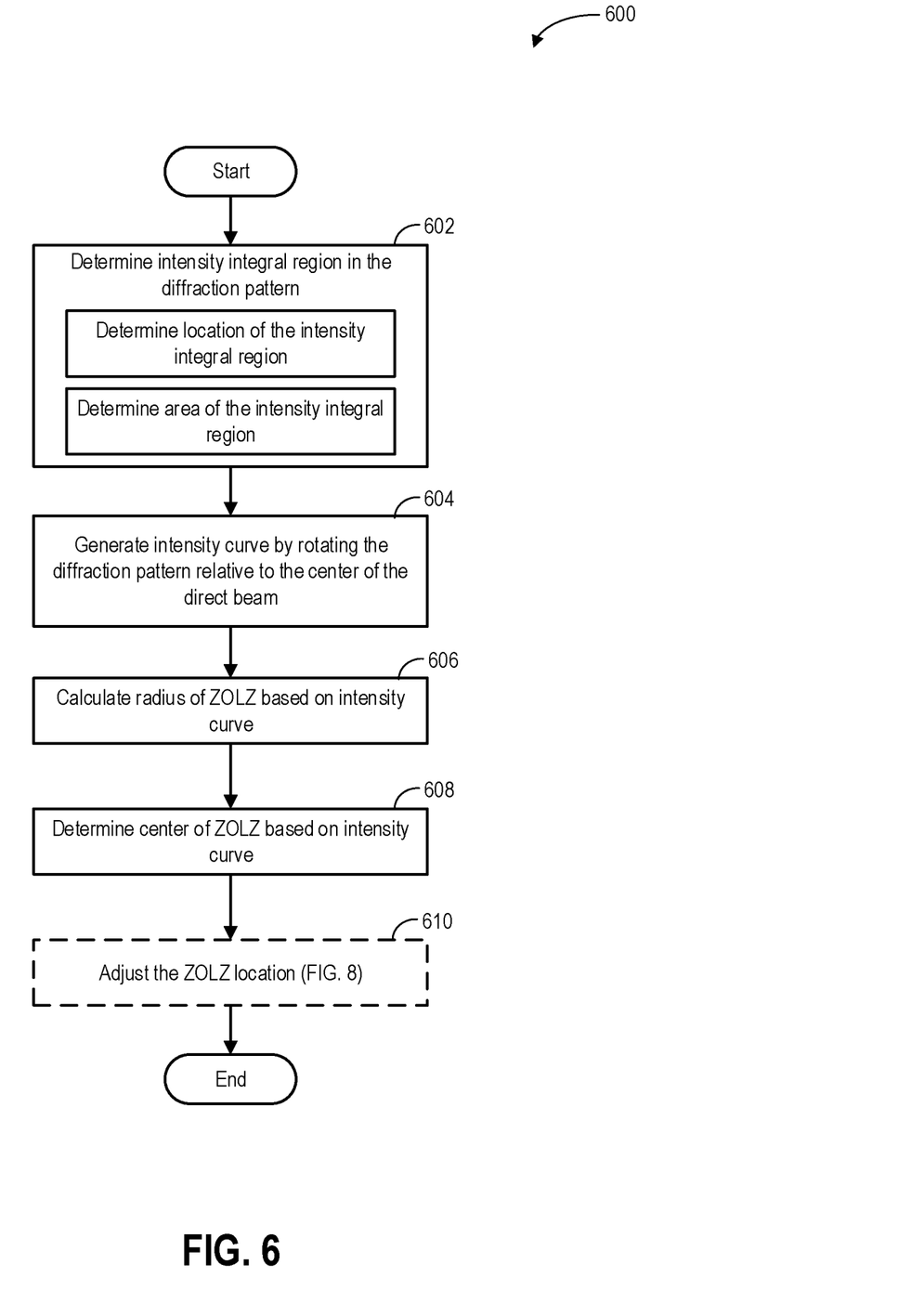
FIG. 6 shows an example subroutine for determining a location of the zero order Laue zone (ZOLZ) in the diffraction pattern.

FIGS. 5A-5C show examples of diffraction patterns acquired at different incident angles. FIG. 5D is the combined diffraction pattern generated by combining the diffraction patterns of FIGS. 5A-5C. FIG. 5B is the diffraction pattern without adjusting the incident beam angle (such as the un-tilted diffraction pattern acquired at 306 of FIG. 3). FIG. 5A and FIG. 5B are acquired after tilting the sample stage −3 degrees and 3 degrees in the alpha tilt direction, respectively. The location of the direct beam 501 in the diffraction patterns does not change, while location of the rest of high intensity spots in the diffraction patterns vary with the tilt angle. By taking the running average of the diffraction patterns of FIGS. 5A-5C, the signal contrast of the direct beam in the combined diffraction pattern of FIG. 5D increases, while the signal contrast of the rest of the diffraction patterns decrease. The edge of the high contrast signals in the combined diffraction pattern may be fitted with circle 502. The center of the direct beam is the same as the center of circle 502, and the radius of the direct beam is the same as the radius of circle 502.

FIG. 6 shows subroutine 600 for determining location of ZOLZ in a diffraction pattern based on the direct beam location. The location of ZOLZ includes the center of the ZOLZ and the size, such as the radius, of the ZOLZ. The location of the ZOLZ may be determined by determining an axis passing the centers of the direct beam and the ZOLZ. The axis passing the centers of the direct beam and the ZOLZ may be determined by rotating the diffraction pattern relative to the center of the direct beam. As the diffraction pattern rotates, intensity of pixels in a non-rotating intensity integral region fluctuates, and the location, including the center and the radius of the ZOLZ may be estimated based on the intensity variation and the location of the direct beam.

At 602, the intensity integral region for the diffraction pattern may be determined. Determining the intensity integral region may include determining the location and area of the region. Further, the shape of the intensity integral region may be determined. In one embodiment, the intensity integral region is rectangle. In other embodiments, the intensity integral region may be in other shapes, such as a circle. The distance between the intensity integral region to the direct beam center may be greater than the radius of the direct beam and small enough so that small zone axis tilt may be estimated. In one example, the distance between the intensity integral region and the direct beam center may be a fixed value. In another example, the distance between the intensity integral region and the direct beam center may be determined based on the radius of the direct beam. The distance may increase with increased direct beam radius. For example, the distance may be two times of the direct beam radius. In yet another embodiment, the distance between the intensity integral region and the direct beam center may be adjusted based on the pixel values of the diffraction pattern within the intensity integral region. In one example, the distance increases responsive to the total pixel value within the intensity integral region higher than a threshold level. Because when the total pixel value is high, the intensity integral region may include a large portion of the direct beam. In another example, the distance is determined based on the total pixel value within intensity integral regions at different distances from the direct beam. The area of the intensity integral region should be large enough in order to include sufficient features of the diffraction pattern. On the other hand, the area of the intensity integral region should be small enough to reflect the spatial change in the diffraction pattern. In one example, the area of the integral region is one fourth of the area of the integral region.

Figures 7A, 7B:
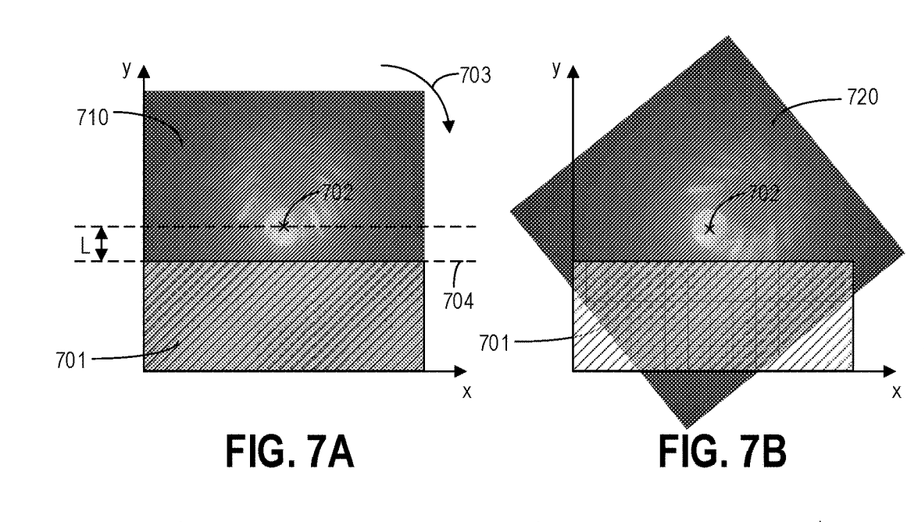
FIGS. 7A, 7B, and 7C illustrate processes for generating an intensity curve from a diffraction pattern.

FIG. 7A is an example intensity integral region 701 of diffraction pattern 710. The diffraction pattern is displayed in the x-y plane. The distance L between the center 702 of the direct beam and upper boundary 704 (that is, boundary with highest y-axis value) of the intensity integral region is twice of the radius of the direct beam. The intensity integral region covers the diffraction pattern 710 below (that is, with lower y-axis value) the upper boundary 704 of the intensity integral region. In other embodiments, the intensity integral region may cover a part of the diffraction pattern 710 below the upper boundary 704.

Figure 7C:
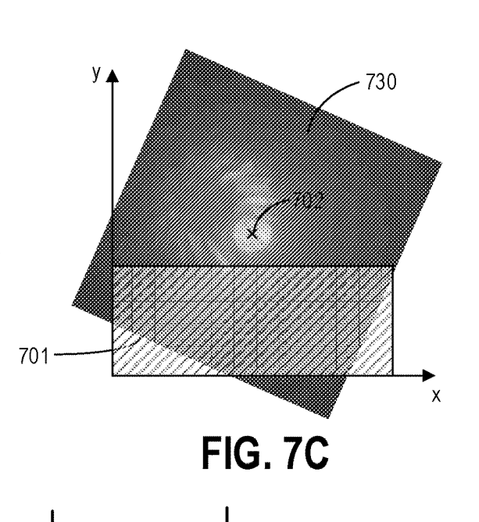
Figure 7D:
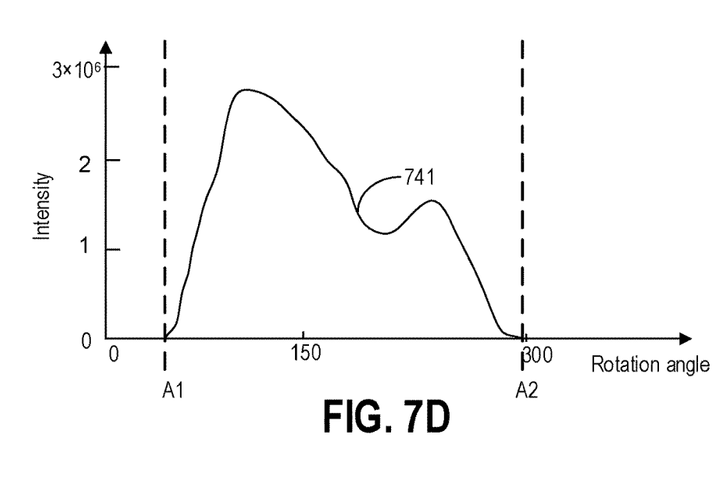
FIGS. 7D and 7E show example intensity curves.

Turning back to FIG. 6, at 604, the intensity curve may be generated by integrating pixel values in the intensity integral region while rotating the diffraction pattern relative to the center of the direct beam. The intensity integral region is not rotated while the diffraction pattern is rotated. As an example, FIG. 7B and FIG. 7C show the rotated diffraction patterns 720 and 730, which are obtained by rotating the diffraction pattern 710 of FIG. 7A relative to the direct beam center 702 in the clockwise direction 703. The diffraction patterns 720 and 730 of FIGS. 7B-7C are rotated A1 and A2 degrees relative to the diffraction pattern 710 of FIG. 7A, respectively. At each rotation angle, an intensity may be calculated by summing up values of pixels in the overlapped region between the rotated diffraction pattern and the non-rotated intensity integral region. As the diffraction pattern rotates 360 degrees, an intensity curve may be generated. FIG. 7D shows the intensity curve generated for the diffraction pattern 710 of FIG. 7A. The x-axis is the rotation angle, and the y-axis is the intensity calculated at the respective rotation angle. The rotation angle represents an angle rotated clockwise from the y-axis. The intensity curve starts from zero, indicating that the bright spots (pixels with high value) in the diffraction pattern 710 of FIG. 7A are outside of the intensity integral region 701. As the diffraction pattern 710 rotates clockwise, the intensity increases from zero at rotation angle A1, indicating the bright spots in the diffraction pattern entering the intensity integral region (as shown in FIG. 7B). The intensity curve fluctuates and is nonzero from rotation angle A1 to A2. The intensity curve reaches zero at A2 and remains zero till a full rotation (that is, 360 degrees). This indicates that the bright spots in the diffraction pattern exited the intensity integral region at rotation angle A2, as shown in FIG. 7C. Based on the rotation angles A1 and A2, as well as the location of the direct beam, the location of the ZOLZ may be estimated.

At 606, the radius of the ZOLZ may be calculated based on the intensity curve. In one embodiment, the ZOLZ radius may be calculated based on rotation angles when the intensity curve intersects with a low threshold intensity. The low threshold intensity may be determined based on the noise level. The low threshold intensity may be zero if background noises are removed. In one example, the ZOLZ radius may be determined based on the rotation angles at which the intensity curve intersects with the low threshold intensity. In another example, the ZOLZ radius may be determined based on the range of rotation angles within which the intensity curve is not greater than the low threshold intensity. A mis-tilt direction angle corresponds to a mis-tilt direction may be determined based on the rotation angles at which the intensity curve intersects with the low threshold intensity. For example, for the intensity curve 741 of FIG. 7D, the intensity curve between rotation angles A1 and A2 are above the low threshold intensity of zero. The mis-tilt direction angle is calculated as $$A = \frac{A2 + A1}{2} - 90.$$

Figure 7E:
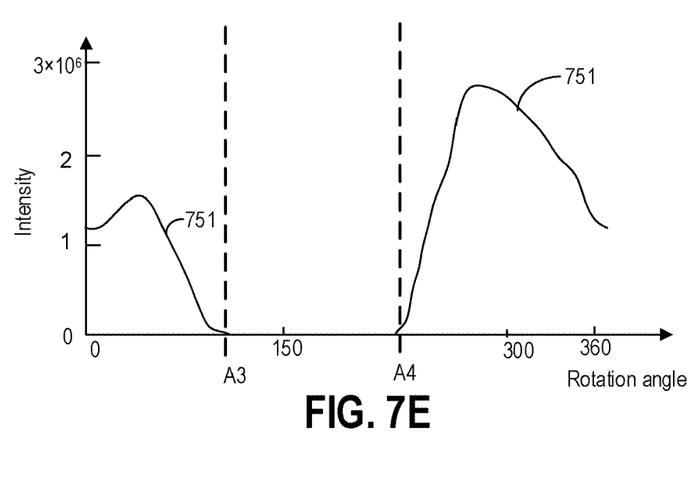

In another exemplary intensity curve 751 of FIG. 7E, the intensity curve is nonzero from zero to A3 degree of rotation angle and from A4 to 360 degrees of rotation angle. The intensity curve 751 remains zero from rotation angles A3 to A4. As such, for intensity curve 751, the mis-tilt direction angle A is calculated as $$A = \frac{A4 + A3}{2} + 90.$$

The ZOLZ radius R may then be calculated as $$R = r \cdot \left(\frac{L}{r} - \cos(A)\right) / (1 - \cos(A)),$$

wherein L is the distance between the direct beam center and the intensity integral region, and r is the radius of the direct beam.

Turing back to FIG. 6, at 608, the location of the ZOLZ center may be determined based on the intensity curve, the radius of the ZOLZ, and the location of the direct beam. In one embodiment, a misalignment vector from the direct beam center to the ZOLZ center may be determined based on the mis-tilt direction angle A, and the location of the ZOLZ center may be determined based on the misalignment vector. The magnitude of the misalignment vector is proportional to (R−r)/r. The direction of the misalignment vector overlaps with the axis passing the centers of the direct beam and the ZOLZ. The direction of the misalignment vector may the determined based on the mis-tilt direction angle A. In one example, for the intensity curve 741 of FIG. 7D, the direction of the misalignment vector is A degrees clockwise relative to the y-axis. In another example, for the intensity curve 751 of FIG. 7E, the direction of the misalignment vector is A degrees clockwise relative to the y-axis.

At 610, the radius and the center of the ZOLZ determined at 606 and 608 may optionally be further adjusted. In one embodiment, the location of the ZOLZ center determined from 608 may be adjusted by fitting a ring to cover a region with highest pixel intensities. In one example, the width of the ring may have a predetermined width, such as the radius of the direct beam. The outer radius of the ring may be the ZOLZ radius determined at 606. The location of the ring may be determined via an optimization process, wherein the initial location of the center of the ring is the ZOLZ center determined at 608. The radius of the ZOLZ may be adjusted based on the adjusted location of the ZOLZ center and the direct beam location. As an example, FIG. 8 shows a diffraction pattern with adjusted ZOLZ center 801. The ZOLZ center 801 is the center of ring 802. Location of ring 802 is obtained via an optimization process by maximizing the total signal intensity covered by the ring.

In this way, the ZOLZ location in a diffraction pattern may be determined based on the intensity curve generated by integrating pixel values within the non-rotated intensity integral region when the diffraction pattern is rotated relative to the direct beam center. The ZOLZ location may be further adjusted to increase accuracy.

FIG. 9 illustrates determining the zone axis tilt based on locations of the direct beam and the ZOLZ. The diffraction pattern is plotted in the x-y plane. The circumference 904 of the direct beam intersects the circumference 901 of ZOLZ. The coordinates of the direct beam center 902 and the radius 903 may be determined at 310 of FIG. 3. The coordinates of the ZOLZ center 905 and the radius of ZOLZ may be determined at 312 of FIG. 3. The axis 909 passes the direct beam center 902 and the ZOLZ center 905. The misalignment vector 908 originates from the direct beam center 902 and points to the ZOLZ center 905. The zone axis tilt may be determined based on the misalignment vector 908. For example, the zone axis tilt may include an alpha tilt component (in degrees) and a beta tilt component (in degrees), which represent the zone axis misalignment in the alpha and beta tilt directions of the sample holder, respectively. As an example, the beta tilt component may be proportional to the projection of the misalignment vector 908 in the x-axis direction, and the alpha tilt component may be proportional to the projection of the misalignment vector 908 in the y-axis direction. The amplitude of the zone axis tilt is also proportional to the difference between the ZOLZ radius and the direct beam radius, and inversely proportional to the direct beam radius. Thus, the beta tilt angle may be calculated based on the production of the beta tilt component, $$\frac{R-r}{r},$$

and the convergent angle of the incident beam. The alpha tilt angle may be calculated based on the production of the alpha tilt component, $$\frac{R-r}{r},$$

and the convergent angle of the incident beam.

In this way, the zone axis of the sample may be aligned with the incident beam based on the estimated zone axis tilt. The alignment may be performed automatically with minimal or no input from the operator. For example, no beam information, such as the convergent angle, is required for the alignment. Because the scanning or imaging can be performed after zone axis alignment without mode switching or beam profile adjustment, the total imaging time of the sample may be reduced.

The technical effect of determining the location of the direct beam based on a plurality of diffraction patterns acquired with different incident angles is that the direct beam may be identified and separated from the rest of the diffraction pattern. Further, direct beam location may be determined when the sample is irradiated with a convergent incident beam. The technical effect of determining the location of the ZOLZ by rotating the diffraction pattern is that the axis passing the centers of direct beam and ZOLZ may be determined. The center of the ZOLZ may be determined based on the axis passing the centers of direct beam and ZOLZ. The technical effect of calculating an intensity curve by summing up the pixel values of the rotated diffraction pattern within the intensity integral region is that the radius of the ZOLZ may be calculated based on the rotation angles wherein the intensity curve intersected with the low intensity level.

The invention claimed is:

1. A method for aligning a zone axis of a sample with an incident beam, comprising:
   acquiring a first diffraction pattern of the sample by directing the incident beam at a first angle towards the sample;
   acquiring a second diffraction pattern of the sample by directing the incident beam at a second angle towards the sample;
   generating a combined diffraction pattern based on the first diffraction pattern and the second diffraction pattern,
   determining a location of a direct beam in the first diffraction pattern based on the combined diffraction pattern; and
   aligning the zone axis of the sample with the incident beam based on the location of the direct beam.

2. The method of claim 1, wherein the incident beam is a convergent beam.

3. The method of claim 1, wherein determining the location of the direct beam in the first diffraction pattern includes determining a center of the direct beam and a radius of the direct beam in the first diffraction pattern.

4. The method of claim 1, wherein aligning the zone axis of the sample with the incident beam based on the location of the direct beam includes determining a zone axis tilt between the zone axis of the sample and the incident beam directed at the first angle towards the sample based on the location of the direct beam, and aligning the zone axis of the sample with the incident beam based on the zone axis tilt.

5. The method of claim 4, wherein determining the zone axis tilt based on the location of the direct beam includes determining a location of zero order Laue zone (ZOLZ) in the first diffraction pattern based on the location of the direct beam, and determining the zone axis tilt based on the location of ZOLZ.

6. The method of claim 5, wherein determining the location of ZOLZ in the first diffraction pattern based on the location of the direct beam includes: rotating the first diffraction pattern relative to a center of the direct beam, generating an intensity curve corresponding to pixel values in an overlapped region between an integration integral region and the rotated first diffraction pattern, and determining the location of ZOLZ based on the intensity curve.

7. The method of claim 6, further comprising determining an intensity integral region based on a radius of the direct beam.

8. The method of claim 6, wherein determining the location of ZOLZ based on the intensity curve includes determining location of ZOLZ based on a rotation angle at which the intensity curve intersects a threshold intensity.

9. A method for aligning a zone axis of a sample with an incident beam, comprising:
   acquiring a plurality of diffraction patterns of the sample by adjusting an incident angle between the sample and the incident beam;
   generating a combined diffraction pattern based on the plurality of diffraction patterns;
   determining a location of a direct beam in the plurality of diffraction patterns based on the combined diffraction pattern; and
   aligning the zone axis of the sample with the incident beam based on the location of the direct beam.

10. The method of claim 9, further comprising determining a radius of a zero order Laue zone (ZOLZ) in one of the plurality of diffraction patterns, and aligning the zone axis of the sample with the incident beam based further on the radius of the ZOLZ.

11. The method of claim 9, wherein the incident angle is adjusted by tilting the sample via a sample holder.

12. The method of claim 9, wherein acquiring the plurality of diffraction patterns of the sample by adjusting the incident angle between the sample and the incident beam includes acquiring three diffraction patterns by tilting the sample at a predetermined step.

13. The method of claim 9, wherein the incident beam is a collimated beam.

14. The method of claim 9, further comprising after aligning the zone axis of the sample with the incident beam, scanning the sample by shifting the incident beam over the sample.

15. An imaging system, comprising:
a sample holder for holding a sample;
a source for generating charged particles;
a focusing column for directing the charged particles to the sample;
a detector for acquiring a diffraction pattern of the sample; and
a controller with computer readable instructions stored on a non-transitory memory configured to:
acquire a first diffraction pattern by directing the charged particles at a first angle to the sample;
acquire a second diffraction pattern by directing the charged particles at a second angle to the sample;
generate a combined diffraction pattern based on the first diffraction pattern and the second diffraction pattern,
determine a location of a direct beam in the first diffraction pattern based on the combined diffraction pattern, estimate a zone axis tilt between a zone axis of the sample and a direction of the charged particles towards the sample based on the location of the direct beam; and
align the zone axis of the sample with the charged particles based on the estimated zone axis tilt.

16. The imaging system of claim 15, wherein the second diffraction pattern is acquired after acquiring the first diffraction pattern, and the controller is configured to direct the charged particles at the second angle to the sample from the first angle to the sample by tilting the sample relative to the direction of the charged particles via the sample holder.

17. The imaging system of claim 16, wherein the controller is further configured to estimate a difference between the first angle and the second angle based on the first diffraction pattern and the second diffraction pattern, and determine an error in the zone axis tilt estimation by comparing the estimated difference between the first angle and the second angle with a tilt angle of the sample.

18. The imaging system of claim 15, wherein the imaging system is a scanning transmission electron microscopy system, and the controller is further configured to scan the sample after aligning the zone axis of the sample with the charged particles without adjusting a convergent angle of the charged particles.

19. The imaging system of claim 15, wherein estimate the zone axis tilt between the zone axis of the sample and the direction of the charged particles based on the location of the direct beam includes determine a radius of a zero order Laue zone (ZOLZ) in the second diffraction pattern by rotating the second diffraction pattern relative to a center of the direct beam, and determine the zone axis tilt based on a radius of the direct beam and the radius of the ZOLZ.

\* \* \* \* \*